(12) United States Patent
De Poortere

(10) Patent No.: US 7,840,012 B2
(45) Date of Patent: Nov. 23, 2010

(54) AUDIO CONDITIONING APPARATUS, METHOD AND COMPUTER PROGRAM PRODUCT

(75) Inventor: Gerrit Frederik Magdalena De Poortere, Leuven (BE)

(73) Assignee: Koninklijke Philips Electronics N.V., Eindhoven (NL)

( * ) Notice: Subject to any disclaimer, the term of this patent is extended or adjusted under 35 U.S.C. 154(b) by 471 days.

(21) Appl. No.: 10/565,815

(22) PCT Filed: Jul. 19, 2004

(86) PCT No.: PCT/IB2004/051254

§ 371 (c)(1),
(2), (4) Date: Jan. 24, 2006

(87) PCT Pub. No.: WO2005/011111

PCT Pub. Date: Feb. 3, 2005

(65) Prior Publication Data

US 2006/0188104 A1    Aug. 24, 2006

(30) Foreign Application Priority Data

Jul. 28, 2003  (EP) .................................. 03102310

(51) Int. Cl.
 H03G 3/20 (2006.01)
 H03G 3/00 (2006.01)
(52) U.S. Cl. .................. 381/57; 381/104; 381/105; 381/107
(58) Field of Classification Search ........... 381/58, 381/94.3, 57, 104–109
 See application file for complete search history.

(56) References Cited

U.S. PATENT DOCUMENTS

| | | | |
|---|---|---|---|
| 4,641,344 A | 2/1987 | Kasai et al. | |
| 4,868,881 A | 9/1989 | Zwicker et al. | |
| 5,046,105 A | 9/1991 | Bohn | |
| 5,434,926 A | 7/1995 | Watanabe et al. | |
| 5,509,081 A | 4/1996 | Kuusama | |
| 6,360,187 B1* | 3/2002 | Hermann | 702/191 |
| 6,891,954 B2* | 5/2005 | Takahashi et al. | 381/71.4 |
| 7,006,624 B1* | 2/2006 | Philipsson et al. | 379/388.03 |

FOREIGN PATENT DOCUMENTS

| | | |
|---|---|---|
| GB | 2074408 A | 10/1981 |
| WO | 02067418 A1 | 8/2002 |
| WO | 03015082 A1 | 2/2003 |

* cited by examiner

Primary Examiner—Vivian Chin
Assistant Examiner—George Monikang

(57) ABSTRACT

The audio conditioning apparatus (190) for conditioning an audio signal (O) to be output, contains a noise characterizing unit (106, 112) arranged to evaluate a noise level (NM) of environmental noise yielding a noise level with which subsequently a volume amplification unit (140) amplifies a volume of the audio signal (O) by a volume gain (GV), depending on the noise level (NM). The audio conditioning apparatus (190) contains a further noise characterizing unit (108,114), (110, 116) is comprised, arranged to evaluate a further noise level (NL, NH) of the environmental noise in a noise band of low bass or high treble noise frequencies, and based on this further noise level a further amplification unit (150, 152) amplifies by a further gain (GB, GT) the amplitude of frequency components in a to the noise band corresponding audio band of low respectively high audio frequencies of the audio signal (O). The result is a simple apparatus which achieves that the audio in a noisy environment substantially sounds as if there was no or less noise.

9 Claims, 5 Drawing Sheets

AUDIO CONDITIONING APPARATUS, METHOD AND COMPUTER PROGRAM PRODUCT

Figure 1:
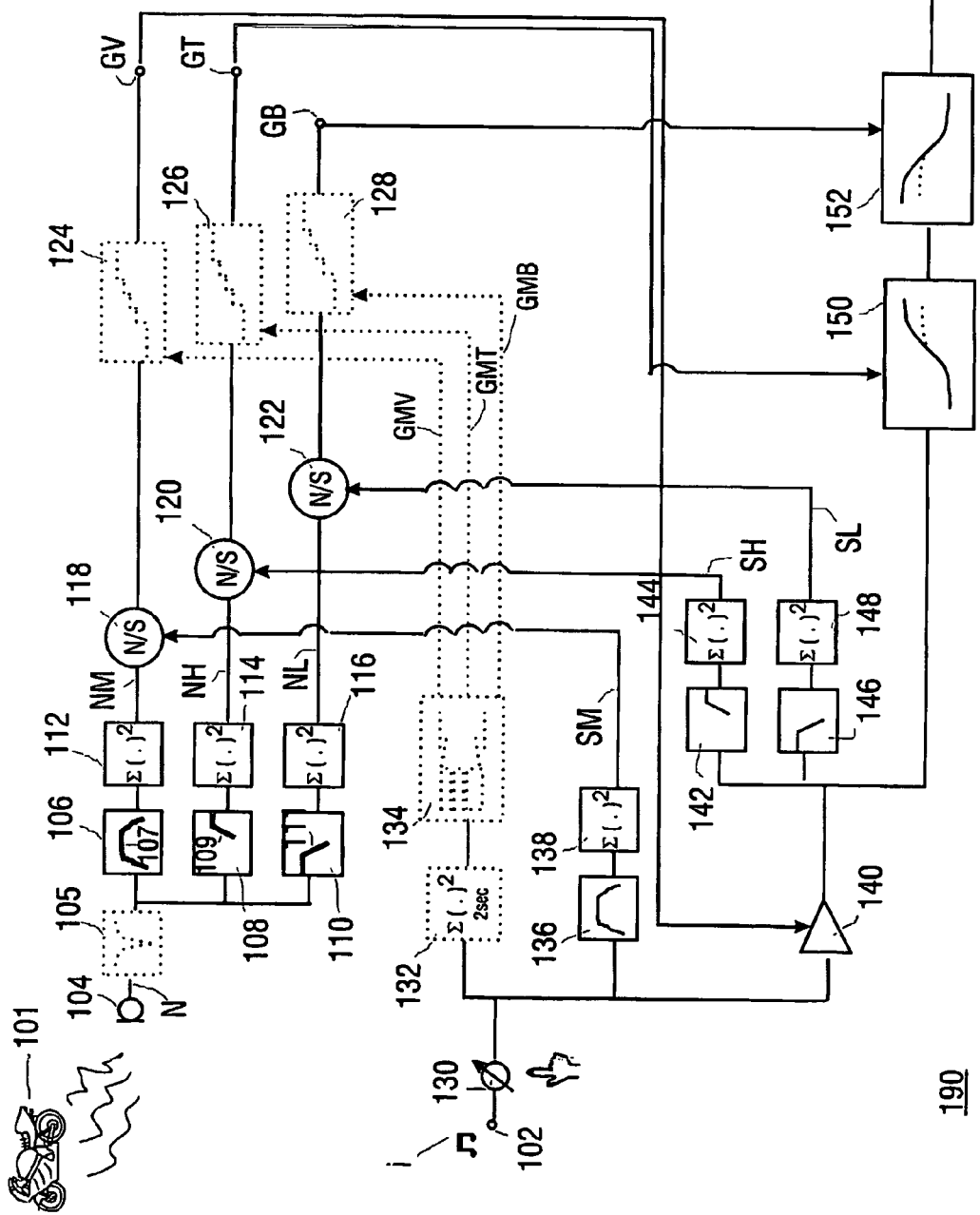

The invention relates to an audio conditioning apparatus for conditioning an audio signal to be output, comprising:

a noise characterizing unit arranged to evaluate a noise level of environmental noise; and a volume amplification unit arranged to amplify a volume of the audio signal by a volume gain, depending on the noise level.

The invention also relates to a method of conditioning an audio signal, comprising:

evaluating a noise level of environmental noise; and amplifying a volume of the audio signal by a volume gain, depending on the noise level.

The invention also relates to a computer program product enabling a processor to execute the method.

An embodiment of an audio conditioning apparatus as in the opening paragraph is known from GB-A-2,074,408. The apparatus is embodied in a car radio and increases the volume of the outputted audio signal as a function of the level of the environmental noise in the car, such as motor noises, wind noise, talking, etc. Typically the amplification is a monotonously increasing function of the environmental noise. A microphone is used to pick up the environmental noise, from which resulting noise signal a noise level is derived for controlling a volume amplification unit, so that the desired audio signal sounds louder than the noise.

It is a disadvantage of the known apparatus that the audio is conditioned rather crudely. In fact, a listener is not interested in having annoying loudness increases, but rather in the fact that the music or other audio should dominate audibly over the environmental noise.

It is a first object of the invention to provide an audio conditioning apparatus as in the opening paragraph, which is capable of conditioning the audio in response to the noise in a perceptually enjoyable way.

The first object is realized in that:

a further noise characterizing unit is comprised, arranged to evaluate a further noise level of the environmental noise in a bass frequency noise band or a treble frequency noise band, and a further amplification unit is comprised, arranged to amplify by a further gain the amplitude of frequency components in a bass frequency audio band respectively a treble frequency audio band of the audio signal, in dependence of the further noise level.

The basic principle according to the invention is that noise is measured and the audio signal correspondingly conditioned to mask the noise in perceptually allowable frequency bands, namely bass and/or treble bands. Preferably the noise is analyzed in two or more bands, namely a first noise band which has a frequency range corresponding to the bass frequency audio band of low i.e. bass frequencies in the audio signal to be output, respectively a treble frequency first noise band comprising frequencies in the audio treble range, and a second noise band, which is substantially complementary to the first noise band, i.e. covers the frequencies not in the first noise band range. With corresponding is meant that preferably the noise is measured for approximately the same frequencies which are conditioned in the audio, i.e. the frequency range of the bass frequency noise band and the bass frequency audio band is substantially similar. So if e.g. the lowest audio frequency present in the audio signal is 50 Hz, and the conditioning comprises an amplification of frequencies between 50 Hz and 100 Hz, then the noise is measured for those bass frequencies. However, as the skilled person can readily implement, an alternative realization of the audio conditioning apparatus may only amplify bass frequency audio components in a bass frequency audio band between 70 and 100 Hz, but measure noise in a bass frequency noise band between 50 and 100 Hz. In this alternative realization the noise in a broader band of bass frequencies is masked by conditioning a narrower band of audio bass frequencies of the audio signal. Or, some frequencies of the bass frequency audio band may be skipped in the bass frequency noise measurement. Instead of a two band noise measurement, both the bass and treble noise may be measured implying both a bass and treble audio conditioning, and the invention and its advantages are described in the text with the aid of an embodiment in which the audio is controlled in both a bass and a treble band—and correspondingly the noise measured in three bands, namely a low frequency or bass band, a mid frequency band, and a high frequency or treble band. In contrast to prior art as in GB-A-2,074,408, the (first) environmental noise level, being input for the volume amplification, is according to the invention typically measured in a mid range noise band of frequencies between the bass and treble range, i.e. e.g. between 100 and 8000 Hz.

Consider for a simplified explanation of the advantageous working of the invention an input audio signal containing a kettle drum compound in the bass range (e.g. having components between 80 and 160 Hz) and a voice in the mid range (e.g. a vowel sung introducing frequency components between 300 and 3000 Hz). If environmental noise is present only in the bass range (e.g. from a zooming apparatus in the neighborhood), the known volume conditioning apparatus will amplify both the drum and the voice. Hence the singer seems to start singing more loudly, which may be annoying. In the apparatus according to the invention, only the bass will be emphasized, which perceptually does not sound like a (bass) volume increase, but rather as a decrease of the bass frequency noise of the zooming apparatus. Or in other words, the music is more clearly audible over the environmental noise. Furthermore, the known apparatus by amplifying the mid range voice components, wastes more headroom than required for dominating over the noise. The headroom may be e.g. defined as the difference between the present maximal signal amplitude and the maximally allowable signal amplitude, obtainable by setting the amplification of the apparatus to the maximum value made possible by the manufacturer.

There exist in prior art apparatuses which modify the amplitude in critical bands. A critical band is a filter band in the human ear for which a noise component falling within the band can mask an audio component in the band. The bands become ever wider with increasing frequency. A frequency axis can hence be transformed in units of critical band, called barks. Whatever the noise spectrum, e.g. a white noise spectrum, the amplitudes of the audio signal components can be modified within each critical band so that e.g. these components are the same number of perceptually noticeable distances above the noise in that critical band as they were above the absolute hearing threshold before the introduction of noise. The perceptual result of the audio conditioning is not so much a volume increase, but rather a masking of the environmental noise. However an apparatus with the required amount of critical band filters (more than 20) is expensive. Reducing the amount to e.g. 10 brings with it the facts that the perceptual masking—i.e. the perceived reduction of the environmental noise—no longer works optimally, and that the audio is perceived as colored (as if it was sent through an equalizer). The smaller the number of bands, the worse this problem. This is why according to the invention the environmental noise measured in the broad mid range band of frequencies is not used to amplify the amplitude of mid range components in the audio signal, but to adjust the volume of the audio signal (i.e. equal for all frequencies). And further, the amplitude of the signal in one or more bass bands and/or one or more treble bands may be modified, since a listener is long since used to listen to audio with modified bass or treble, hence this is not annoying. For those bass and treble bands, although not exactly critical bands, the perceptual masking of the noise still approximately yields. In many environments an apparatus according to the invention is to be preferred over the known volume conditioning apparatus. E.g. if the apparatus is incorporated in a portable audio player and used in the street, there may be the low frequency hum of a truck waiting in front of a traffic light. In a streetcar there may be the high pitched sound of the wheels grating against the tracks. In a pub the music installation may produce too much bass components. The absorbing characteristics of the room in which the apparatus resides may also influence the environmental noise spectrum, and so on. Stated differently, the apparatus according to the invention conditions the audio so that it sounds relatively similar in environmental noise to the original audio in a noiseless environment.

In an embodiment of the audio conditioning apparatus an upper limit of the audio band of low or bass frequencies substantially lies in the range of 60 to 150 Hz, and a lower limit of the audio band of high or treble frequencies substantially lies in the range of 8 kHz to 12 kHz.

For the invention to work well, the bass and treble band are best chosen according to the specification above. If a bass band is chosen with a limit above 150 Hz, voices, as e.g. in a car radio when the music is interrupted by a news bulletin, will sound boomy and hence less intelligible. 100 Hz or 120 Hz are good values for the bass band upper limit of the bass filters. A treble band limit below 8 kHz results in consonants, like the "s"-sound, which sound unacceptably sharp. So the bass and treble limits are so chosen that there is a broad mid range frequency band in between. Alternative combinations of bass and/or treble bands may be advantageous for alternative embodiments. E.g., instead of a single bass band, two bass bands may be employed in the apparatus, e.g. a deep bass with an upper limit of e.g. 70 Hz, and a punchy bass up to e.g. 150 Hz. If resources allow it, also in the treble band there may be multiple bands, e.g. a first between 8 kHz and 10 KHz, and a second between 10 kHz and 15 KHz. Or since the critical bands are quite wide for high frequencies, in the treble region critical bands may be used.

Since the filters are in general not ideal filters with an infinitely sharp slope, the limit may be defined as e.g. the −3 dB point as compared to the maximum of the filter. The skilled person knows that for the specification of some filters, other definitions of the limit (i.e. the frequency above or below which the level of the filter functional characteristic is diminished with more than a prespecified amount corresponding to its maximum value, or alternatively the frequency above or below which the filter is higher than a certain prespecified amount above its lowest value) and other filter shape parameters may be more preferable, but for clarity the invention is explained with the −3 dB point specifying the limit.

Note that it may seem that with such a small bass band the importance of the bass amplification would be rather small compared to the volume amplification. However often in music—e.g. in pop or techno—the energy in the bass band is comparable to the energy in the mid range, and noises are also often of low frequency.

In a more elaborated embodiment of the audio conditioning apparatus, a gain consistency unit is comprised arranged to yield a gain consistently varying in time, according to a predetermined mathematical criterion.

If e.g. a motorcycle speeds by, it is no use to quickly condition the audio, especially if the sound of the motorcycle is very loud. Such fast large conditionings will most times sound objectionable, hence it is better not to compensate for the motorcycle since he is gone quickly enough. The gain consistency unit analyses how large a required e.g. volume conditioning over the noise is, and then adapts the volume slowly, so that only noises of sufficient temporal continuity are compensated.

In another embodiment of the audio conditioning apparatus a gain dispatcher unit is comprised, arranged to allocate a maximum allowable gain, on the basis of available headroom for amplification.

If there is not much headroom available, it has to be distributed among the volume, bass and treble amplifications. Otherwise, a volume amplification may be calculated and applied which consumes all available headroom, so that no bass and treble amplification are possible anymore. Hence the gain dispatcher unit calculates a maximum gain for each of the amplifications. The dispatcher may evaluate the energy with a slower update rate than the signal and noise characterization rate, e.g. each 2 seconds.

In an embodiment, the further amplification units comprise shelving filters. A shelving filter has a sigmoidal characteristic with a tunable maximum, i.e. a tunable amplification in a particular frequency range. It is an easy way of merging a filter and an amplifier functionality.

In a noise canceling embodiment, the audio conditioning apparatus is connectable to a headphone loudspeaker usable for reproduction of the audio signal, and comprises an active noise canceling unit, arranged to cancel noise in a cancellation band of frequencies, the noise being measurable by a microphone.

Better than masking of noise is cancellation of noise, be it only not to stress a listener's ear too much. With a headphone loudspeaker is to be understood a single ear—as for a mobile phone—or a stereo headphone. Active noise cancellation for headphones is known from prior art. However, the invention can substantially solve the problem of applying noise cancellation when having a standard headphone loudspeaker without a microphone (wiredly or wirelessly) connected to an audio reproduction apparatus with a microphone, which resides e.g. on a belt around the listener's waist. The reproduction apparatus can then measure the environmental noise and condition the audio signal. However, since the noise is not measured at the site of reproduction by the headphone loudspeaker, in or near the listener's ear, the noise can only be compensated in a cancellation band of low frequencies, e.g. up to 100 Hz. The higher noise frequencies are not canceled, but masked with the apparatus with volume amplification and bass and/or treble band amplification described above. Note that for masking the noise need not be measured so accurately as for active noise canceling.

In a further embodiment of the noise canceling embodiment a distance measuring device is comprised arranged to measure a distance between the microphone and the headphone loudspeaker.

The distance between the microphone and the headphone loudspeaker determines the extent of the cancellation band. If the audio reproduction is worn on a belt or around the wrist, a distance of approximately one meter leads to an upper frequency limit of the cancellation band of about 100 Hz. When the apparatus is worn in a breast pocket, a distance of 0.5 meters corresponds to an upper limit of about 140 Hz. For the apparatus being incorporated in e.g. a small MP3 player being worn as a necklace or earring jewel, a short distance of the microphone to the ear means that noise cancellation may work over 200 Hz.

The audio conditioning apparatus is advantageously embodied in an audio reproduction device, comprising:

a loudspeaker for reproduction of the audio signal; and
an access to an input audio signal.

The input signal may be internally generated, such as a ring tone of a mobile phone, or retrieved from e.g. a solid state memory or disk player, which may be incorporated in or external to the audio reproduction device.

It is a second object of the invention to provide an audio conditioning method as in the opening paragraph, which is capable of conditioning the audio in response to the noise in a perceptually enjoyable way. This second object is realized in that:

a further noise level of the environmental noise in a bass frequency noise band or a treble frequency noise band is evaluated, and the amplitude of frequency components in a bass frequency audio band respectively a treble frequency audio band of the audio signal is amplified by a further gain, in dependence of the further noise level.

These and other aspects of the audio conditioning apparatus and the audio reproduction apparatus of the invention will be apparent from and elucidated with reference to the implementations and embodiments described hereinafter, and with reference to the accompanying drawings, which serve merely as a non limiting illustration of some of the aspects or embodiments. Dashed features in the drawings are optional depending on the embodiment.

Figure 2:
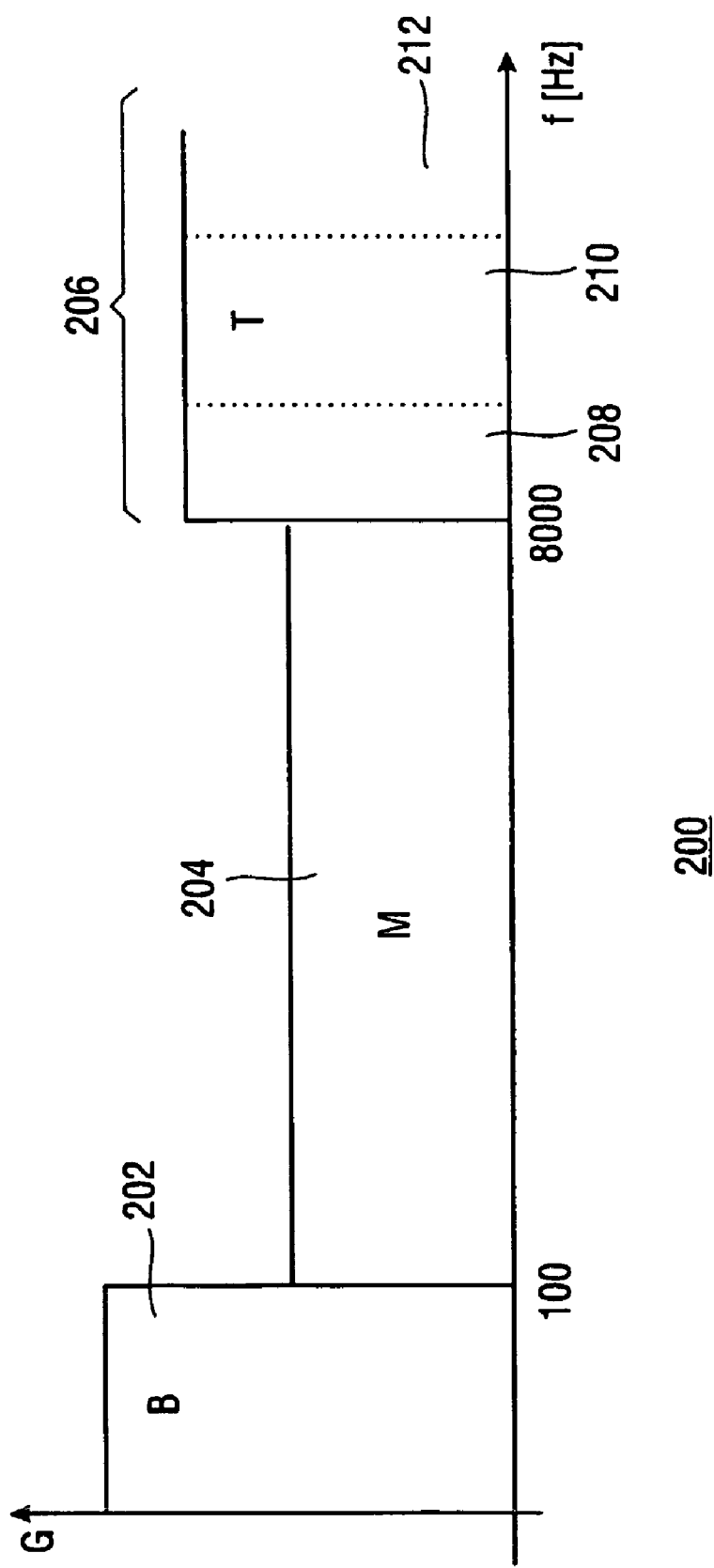
Figure 3:
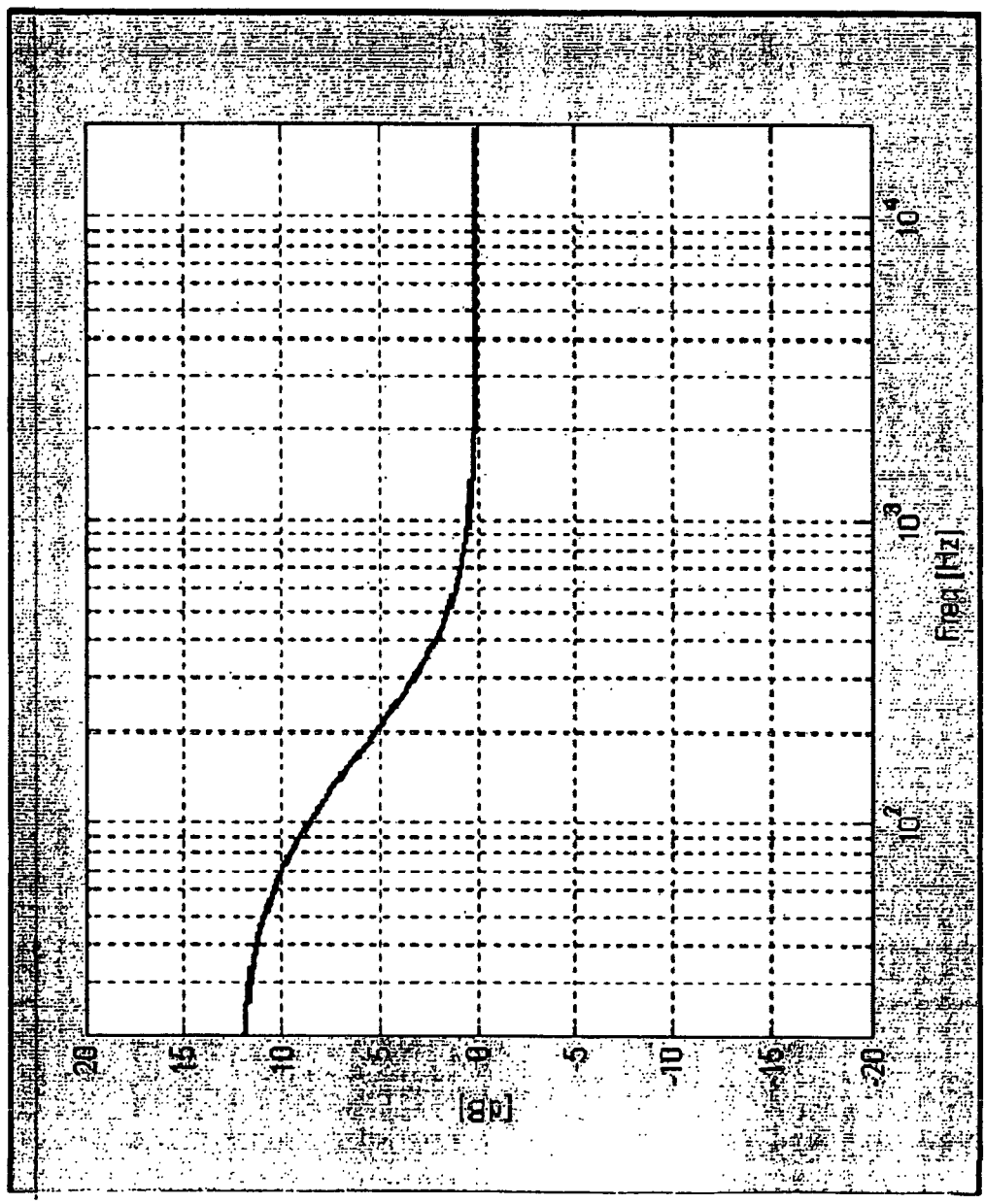
Figure 4:
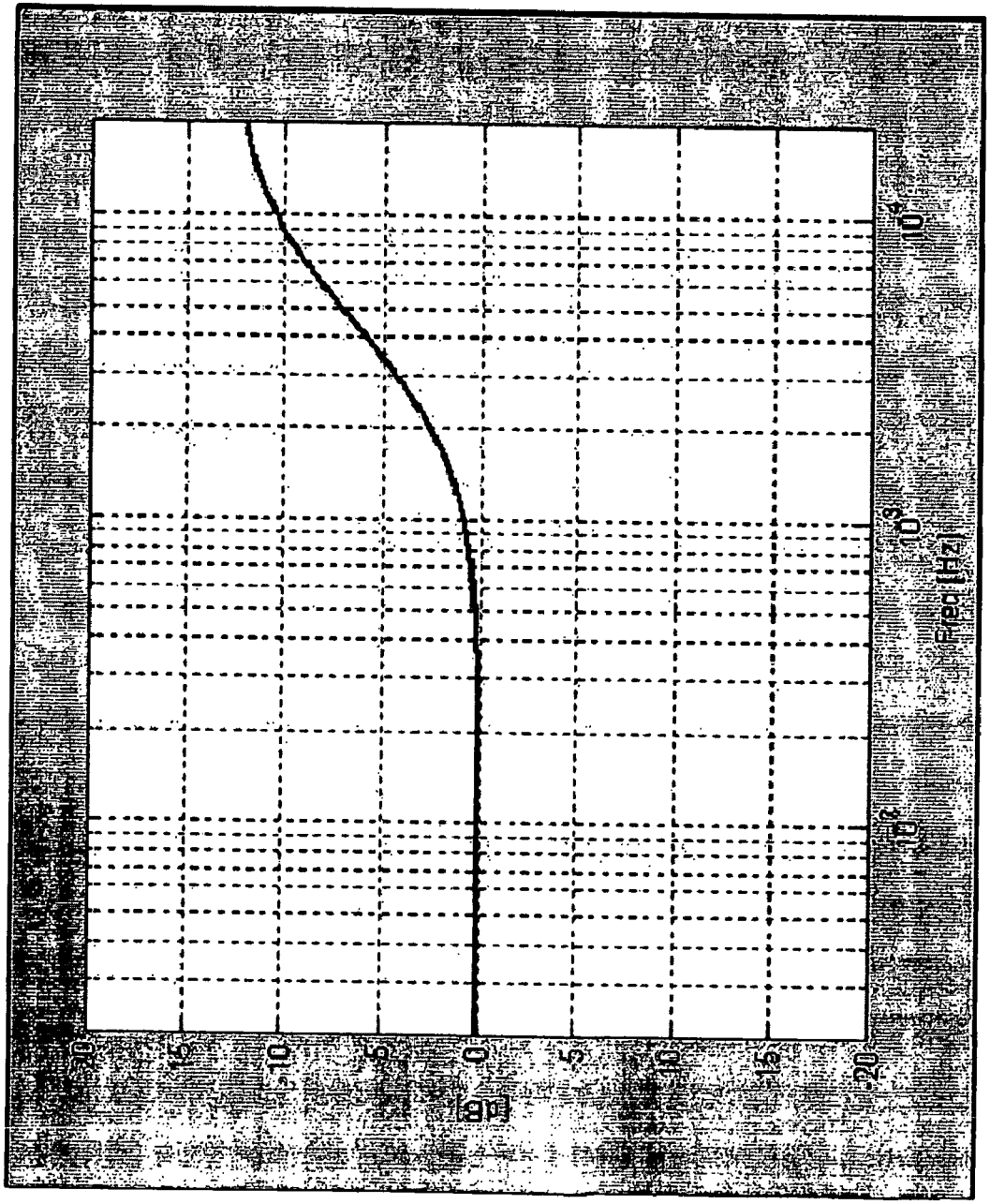

In the drawings:

FIG. 1 schematically shows an embodiment of the audio conditioning apparatus according to the invention;

FIG. 2 schematically shows a low frequency band, a mid frequency band and some high frequency bands of the audio signal or environmental noise signal;

FIG. 3 schematically shows a bass shelving filter;

FIG. 4 schematically shows a treble shelving filter; and

Figure 5:
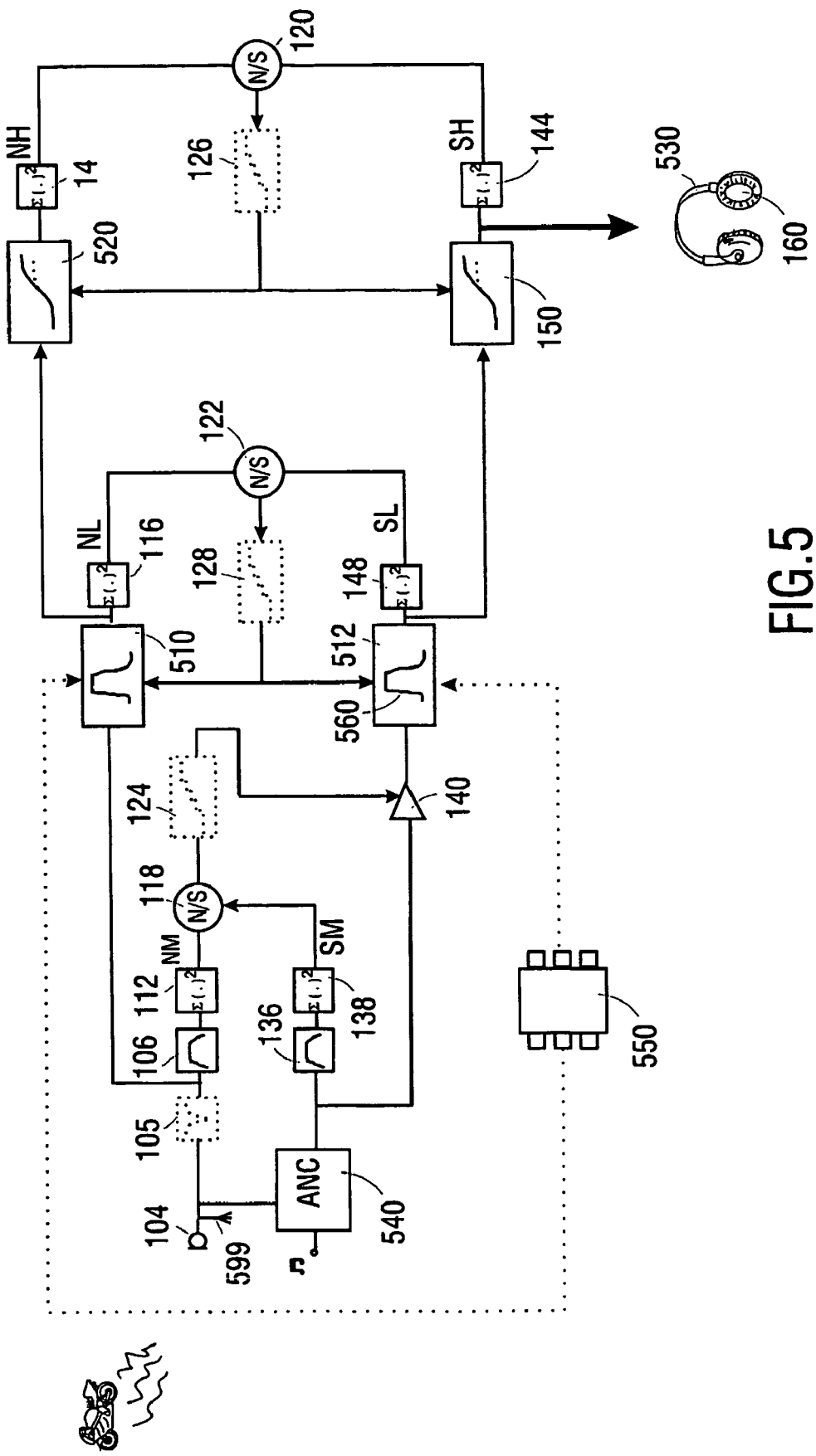

FIG. 5 schematically shows another embodiment of the audio conditioning apparatus according to the invention.

In FIG. 1, noise from a source of environmental noise 101, e.g. a motorcycle or truck waiting before the traffic lights, or an air conditioning humming, is picked up by a microphone 104, which might be included in the apparatus, or connected externally, e.g. via a wireless communication system with a microphone already present in another consumer appliance such as e.g. a mobile phone. The microphone yields an electrical noise signal N, which is optionally filtered with a filter which removes the ear antiresonance frequencies from the noise signal. The ear antiresonance frequencies are those frequencies for which there is destructive resonance in the ear, and since these frequencies are hardly heard by the listener, the audio signal does not have to be conditioned, and hence those frequency components in the noise do not have to be measured. The filter is preferably a notch filter with a notch around 3.5 kHz, corresponding to an ear canal length of 2.5 cm. A mid range noise characterizing unit comprises a mid range noise filter 106 and a level determining unit 112. The mid range noise filter 106 typically is a band pass filter passing a band of frequencies substantially complementary to the frequencies passed by a low pass noise filter 110 and a high pass noise filter 108. However other mid range filters may be used, e.g. measuring the noise in a few characteristic bands in the mid range. The principle of the invention of having a mid range band determining the output audio volume and treble and bass correction bands allows a lot of freedom in specifying the actual filters, and considerable amount of overlap is possible, although when using the full noise spectrum band as midrange band, the apparatus will work suboptimal. The level determining unit 112 determines an energy of the noise N in the mid range band. It may e.g. calculate the square root of the sum of the squares of all frequency components over a predetermined period of time, e.g. 1 second. Other functions may be used by the level determining unit 112 to arrive at a mid range noise level NM, e.g. a time integral of the absolute value of the signal. Similarly a low frequency noise level NL and a high frequency noise level NH may be determined by a corresponding low pass noise filter 110 and second level determining unit 116, respectively a high pass noise filter 108 and third level determining unit 114. For some embodiments of the audio conditioning apparatus, the audio reproduction apparatus may comprise a dynamic bass enhancement, which automatically optimizes the bass. A dynamic bass enhancement avoids unacceptable distortion. It comprises a bass amplification (e.g. by means of a shelving filter) based on the bass content in the input signal. If the signal output by the dynamic bass enhancement is small, the bass amplification may be set high, but if this output signal suddenly becomes large, because the input music becomes louder, a control signal diminished the bass boost. In these embodiments with dynamic bass enhancement no low frequency or bass processing is required, only a high frequency or treble path and a mid range path, since the bass is already amplified optimally. An input audio signal i from an access 102 is similarly processed. A mid range audio filter 136 preferably has the same frequency characteristic as the mid range noise filter 106, and similar design arguments apply to a low pass audio filter 146 and a high pass audio filter 142. The input audio signal i may be generated internally (e.g. electronic music) or obtained from a storage, such as a CD or MP3 source. A user may have at his disposition a volume control 130 (e.g. a turning knob, a button, or a graphical user interface) to set a desired output volume for the input audio signal i. The input audio signal i is amplified to this volume. Note that everywhere the word amplification is used, this evidently should also cover multiplication by a value smaller than 1. To allow the apparatus to judge how much gain is required, a mid range comparator 118, low pass comparator 122 and high pass comparator 120 may be comprised. The comparators yield as output a proposed gain. The comparators compare the noise energy in a band—e.g. the low pass band—and the audio signal level or energy in a corresponding signal band, e.g. by calculating their ratio. If the audio signal level is below a predetermined value K times the environmental noise level (K equaling e.g. 1 or 1.5), the audio volume amplification and/or amplification of components in the bass or treble audio band should be amplified by a gain value so that the signal is after amplification above K times the noise level in the particular bands. An improved embodiment of the audio conditioning apparatus 190 comprises gain consistency units 124, 126, 128 to change the gain in a temporally more consistent way.

Otherwise the gains jitter too much in response to each occurring background noise. The gain consistency units 124, 126, 128 may e.g. be arranged to employ the following calculation:

If $Gin_k > T_u Gin_{k-1}$

Then $Gout_k = Min(Fac_u Gout_{k-1}, GM)$

Else{

If $Gin_k < T_d Gin_{k-1}$

Then $Gout_k=\text{Max}(Fac_d Gout_{k-1}, G\text{Min})\}$

Else $Gout_k = Gout_{k-1}$ [Eq. 1]

With G is indicated one of the gains being a volume gain GV, a bass gain GL or a treble gain GH depending on which (bass, volume or treble) gain consistency unit 128, 124, 126 is meant. Similarly, GM indicates a volume, bass or treble maximum allowable gain (GMV, GMB, or GMT). The equations of Eq. 1 introduce a kind of hysteresis behavior. A new proposed gain $Gin_k$ at time instant k from the corresponding comparator is input to the gain consistency unit. If the new gain is not too different from the previous gain $Gin_{k-1}$—if it is not above a preset threshold constant $T_u$ times the previous gain $Gin_{k-1}$—, then the new output gain $Gout_k$ stays the same as the previous output gain $Gout_{k-1}$, to avoid gain oscillations. If the new gain $Gin_k$ is considerably higher than the previous gain $Gin_{k-1}$, the new output gain is increased relative to the old output gain. But the new output gain is not set equal to the proposed new input gain. Rather, the output gain is adapted in small steps. In this way the gain adapts smoothly when a temporally consistent regime of higher environmental noise occurs. Advantageously the adaptation steps $Fac_u$ are imperceptible differences, namely 1.1 or 1 dB (which a trained listener can only just discriminate in the best conditions). The threshold $T_u$ may also be advantageously chosen to equal a just perceptible difference, namely 3 dB or 1.414, since if the listener hardly perceives any difference, the apparatus need not react. Similarly, $T_d$ may be chosen equal to 1/1.414 and $Fac_d$ equal to 1/1.1. By going down in steps, the gain may become very low in the long run. Therefore, the maximization operator clips the gain at Gmin. Preferably Gmin is chosen to be 1. This means for the volume control that if the signal is already above the noise level, the signal is left untreated (multiplication by 1 amounts to no amplification). Similarly if there is enough bass contribution in the signal, possibly because after volume control a bass contribution which was previously below the bass noise level has been amplified above the bass noise level, the bass band components are also left unchanged. However in other embodiments Gmin may be below 1, corresponding with an amplitude decrease. This may be interesting if the listener has manually set the bass contribution very high, much higher than what is required for the audibility over the environmental bass noise. This bass contribution will however consume headroom, which may be required to amplify treble audio components over treble range noise. But with the current bass setting and an increased treble gain, the system, e.g. the power amplifier before the loudspeaker, will go into saturation. Hence the bass gain consistency unit 128 can decrease the bass contribution with a gain GB of e.g. 0.8, to allocate room for the treble amplification.

A similar rationale lies behind the introduction of a gain dispatcher unit 134. Given the amount of headroom, it is arranged to calculate a maximum allowable volume gain GMV, and/or a maximum allowable bass gain GMB, and/or a maximum allowable treble gain GMT, summarized in Eq. 1 as GM. E.g. if the signal can still be amplified 4 times until all headroom is consumed, and the volume gain GV introduces an amplification of 2 times (in addition to the current amplification by the amplification set by the listener on the volume control 130), then there is still a factor 2 to be divided among the bass and treble gain. Other functions than Eq. 1 can be used to distribute the contribution pro rato instead of by clipping. The maximum gain factors GM may also be fixed instead of being input from the gain dispatcher unit 134. The gain dispatcher unit 134 may employ the following equations:

$GMV = Lim(K_E/E_{in}, G\text{Min}V, GMV)$ $GMT = Lim\{\text{Max}(K_E/E_{in}, G\text{Min}V)/GV, G\text{Min}T, GMT\}$ $GMB = Lim\{\text{Max}(K_E/E_{in}, G\text{Min}V)/GV, G\text{Min}T, GMT\}$ [Eq. 2], in which the Min stands for the minimal allowable gain the M for the maximal allowable gain, and V, B, and T for volume, bass and treble. $E_{in}$ is the energy of the input signal (after manual volume adjustment by the listener) determined by a level determining unit 132, and $K_E$ is an experimentally determined constant. The Lim function is defined as follows:

$$\text{Lim}(x, \min, \max) = \min \text{ if } x < \min$$
$$= \max \text{ if } x > \max$$
$$= x \text{ otherwise}$$

The amplification of the bass and treble audio signal components may advantageously be done with tunable filters of which the signal throughput can be tuned. Such a filter may typically have a sigmoidal characteristic, i.e. it has a transient part between a part of zero dB (or in other words blocking these audio frequency components) and a part of maximum gain equal to 20 log A dB, A being tunable yielding e.g. 12 dB, 10 dB, etc. An example of such a filter is a so-called shelving filter. A bass shelving filter is shown in FIG. 3 and a treble shelving filter in FIG. 4.

The transfer function for the treble filter is e.g.:

$$H = \frac{\left[\frac{(\omega_0^2 + 2A\omega_0 f_s)}{(\omega_0^2 + 2\omega_0 f_s)} z^2 + 2\omega_0^2 \frac{1}{(\omega_0^2 + 2\omega_0 f_s)} z + \frac{(-2A\omega_0 f_s + \omega_0^2)}{(\omega_0^2 + 2\omega_0 f_s)}\right]}{\left[z^2 + 2\omega_0^2 \frac{1}{(\omega_0^2 + 2\omega_0 f_s)} z + \frac{(-2\omega_0 f_s + \omega_0^2)}{(\omega_0^2 + 2\omega_0 f_s)}\right]} \quad [\text{Eq. 3}]$$

$\omega_0 = 2\pi f_0$, where $f_0$ is the frequency for which the filter function has dropped −3 dB corresponding to the maximum gain (12 dB in FIG. 4), equal to e.g. 8500 Hz. $f_s$ is the sampling frequency, equaling e.g. typically 44.1 kHz. A determines the tunable maximum gain of the filter. In the example graph A=4, corresponding to 20 log 4=12 dB. In case the apparatus needs less treble contribution it can set A to e.g. 3. The factor A is determined by the bass gain GB or treble gain GT output by the corresponding gain consistency unit or comparator. Their relation is preferably linear, e.g. with a proportionality constant equal to 1.

The low pass or bass noise filter 110 and high pass or treble noise filter 108, may be second order filters with a functional characteristic roughly corresponding to the functional characteristics of the shelving filters:

$$Hn = M \frac{az^2 + bz + c}{dz^2 + ez + f}, \quad [\text{Eq. 4}]$$

with M, a, b, c, d, e and f predetermined constants.

The mid range noise filter may have the following characteristic:

$$Hmn = M_2 \left( \frac{a_2 z^2 + b_2 z + c_2}{d_2 z^2 + e_2 z + f_2} \right) \left( \frac{g_2 z^2 + h_2 z + i_2}{j_2 z^2 + k_2 z + l_2} \right) \quad [\text{Eq. 5}]$$

Alternatively the bass and treble noise filters may be exactly equal to the shelving filters for conditioning the audio signal, as shown for the treble shelving filter in the embodiment of FIG. 5.

The volume gain controls a standard controllable volume amplification unit 140, which conditions the audio signal before the bass and treble conditioning. In other words, if after volume amplification the bass and/or treble components are already above the bass respectively treble noise, no further bass and/or treble amplification is required nor performed by the apparatus. The conditioned audio signal O can be sent to a loudspeaker 160. This may be a stand alone loudspeaker or a loudspeaker connected to the audio apparatus, e.g. in a car radio system or professional system for e.g. announcing in a station or supermarket. Advantageously however the loudspeaker 160 is a headphone loudspeaker. It may be an in ear or near ear loudspeaker, single or double, for mono or stereo sound. This is useful for portable devices such as e.g. a portable DVD player for in the train, or a mobile phone. When the audio signal is sent to a headphone loudspeaker instead of noise masking as explained above, the audio conditioning apparatus may also apply partial noise canceling as explained with FIG. 5. The part of the noise signal which cannot be cancelled with an active noise cancellation, is masked similarly as above.

FIG. 2 schematically shows different spectral regions of the audio signal (or correspondingly the noise signal), for a masking example which can be realized with box filters and amplifiers. There is one bass band up to 100 Hz, and there are three treble bands 208, 210, 212, leading to a complexity of 5 processing paths for the noise and the signal. A suboptimal solution may e.g. set the three treble gains on the basis of only two treble noise measurements and interpolation or extrapolation.

FIG. 5 shows an embodiment of the audio conditioning apparatus with an active noise canceling unit 540. Also, its masking functionality is realized in a feedback topology rather than in a direct calculation topology. The control values in this case are somewhat different. Rather than directly calculating a gain from the noise to signal ratio N/S, in the feedback topology it is checked whether the signal to noise ratio is larger than a factor K times one.

An active noise canceling unit produces a signal of opposite sign to the noise measured by the microphone 104, which leads to the fact that the noise is substantially cancelled and hence no longer audible. However, noise cancellation only works reasonable if the measured noise signal is also the signal entering the ear. The apparatus according to the invention is so constructed that it can function with a microphone not connected to the headphone loudspeaker, e.g. present in the audio reproduction apparatus, e.g. a mobile phone doubling as MP3 player. In this case only the lowest frequencies, within a cancellation band, can be canceled, since the farther away the microphone is from the headphone loudspeaker, the lower the frequency of the highest frequency component that can still be reliably noise canceled.

One embodiment of the audio conditioning apparatus may have a fixed predetermined upper limit for noise cancellation, e.g. if the apparatus is worn on a waist belt, the distance to the headphone loudspeaker will be about 1 m for an average height person. For this situation the upper limit for the cancellation band will be about 100 Hz. This means that in some embodiments the bass masking may be unnecessary, since the noise cancellation reduces the perceptibility of the environmental noise substantially entirely. In the example of FIG. 5, only part of the bass noise is removed by noise canceling, leaving the rest to be masked. The bass shelving filter 152 becomes in this case a bass band filter 512, with a functional characteristic 560 having a lower limit substantially equal to the upper limit of the noise cancellation band, i.e. e.g. 100 Hz and an upper limit of e.g. 150 Hz. Because the cancelled lowest frequency bass noise need not be masked, it need not be measured for the masking, hence the bass noise filter is designed correspondingly. When the microphone is close to the headphone amplifier, such as is the case when it is incorporated in a jewel to be worn on the head, even the width of the mid range noise band may be reduced.

A more advanced embodiment is equipped to measure the distance between the microphone and headphone loudspeaker, and accordingly adapt the noise cancellation and the bass filter. The following equation may be used for calculating the lower limit of the bass band filter for measuring the noise and conditioning the audio:

$$f_{low} = c/(6 \ast d_{ML}) \quad [\text{Eq. 6}]$$

A comprised distance measuring device 599 may e.g. be a device that measures the time of flight of a waveform, e.g. an electromagnetic or acoustical waveform, between the microphone and the headphone loudspeaker. Such devices are known from prior art. The antenna for receiving the electromagnetic waveform may e.g. be the antenna of a mobile phone and the transmitting antenna may be the antenna of a wireless headphone. The required clock will in general already be present also, so typically only some additional firmware needs to be added. The active noise canceling unit may also be placed in the signal processing direction behind the masking, in which case the masking may still take into account which frequencies may be noise canceled and need not be masked.

All the described functions may be realized in hardware or in software running on a processor 550.

The audio reproduction apparatus may e.g. be a radio, a television, a (laptop) p.c. or game console, a jukebox placed in a pub, a mobile phone, an announcement system, etc. The loudspeaker may be wiredly or wirelessly connected to the audio conditioning apparatus. The audio signal may be mono or stereo, in the latter case the two stereo components typically being processed with the same mono noise measurement.

Under computer program product should be understood any physical realization of a collection of commands enabling a processor—generic or special purpose—, after a series of loading steps to get the commands into the processor, to execute any of the characteristic functions of an invention. In particular the computer program product may be realized as data on a carrier such as e.g. a disk or tape, data present in a memory, data traveling over a network connection—wired or wireless—, or program code on paper. Apart from program code, characteristic data required for the program may also be embodied as a computer program product.

It should be noted that the above-mentioned embodiments illustrate rather than limit the invention and that those skilled in the art are able to design alternatives, without departing from the scope of the claims. Apart from combinations of elements of the invention as combined in the claims, other combinations of the elements within the scope of the invention as perceived by one skilled in the art are covered by the invention. Any combination of elements can be realized in a single dedicated element. Any reference sign between parentheses in the claim is not intended for limiting the claim. The word "comprising" does not exclude the presence of elements or aspects not listed in a claim. The word "a" or "an" preceding an element does not exclude the presence of a plurality of such elements.

The invention can be implemented by means of hardware or by means of software running on a computer.

The invention claimed is:

1. An audio conditioning apparatus for conditioning an audio signal to be output, said audio conditioning apparatus comprising:
   an input for receiving the audio signal;
   a noise characterizing unit for determining a noise level of environmental noise solely in a mid-range frequency noise band;
   a volume amplification unit coupled to said input for amplifying a volume of the audio signal for all frequencies of the audio signal by a volume gain in dependence on solely the noise level in the mid-range frequency noise band;
   a further noise characterizing unit for determining a further noise level of the environmental noise in either a bass frequency noise band or a treble frequency noise band; and
   a further amplification unit coupled to an output of said volume amplification unit for amplifying by a further gain the amplitude of frequency components in a bass frequency audio band or a treble frequency audio band of the audio signal, the value of said further in being dependent solely on the further noise level of the environmental noise in the base or treble frequency band, respectively, to perceptually mask the environmental noise in the base frequency noise band or the treble frequency noise band from a respective base frequency or treble frequency audio band of the volume amplified audio signal,
   wherein said mid-range frequency noise band being complementary to said base frequency noise band and said treble frequency noise band, covering frequencies not in said base frequency noise band and said treble frequency noise band,
   and wherein said audio conditioning apparatus further comprises:
      a gain dispatcher unit coupled to said input for allocating a maximum allowable gain of the volume amplification unit and the further amplification unit on the basis of available headroom for amplification.

2. The audio conditioning apparatus as claimed in claim 1, wherein an upper limit of the bass frequency audio band substantially lies in the range of 60 to 150 Hz, and wherein a lower limit of the treble frequency audio band substantially lies in the range of 8 kHz to 12 kHz.

3. The audio conditioning apparatus as claimed in claim 1, wherein said audio conditioning apparatus further comprises:
   a gain consistency unit coupled to said noise characterizing unit and said further noise characterizing unit for yielding a gain consistently varying in time, according to a predetermined mathematical criterion.

4. The audio conditioning apparatus as claimed in claim 1, wherein the further amplification unit comprises a shelving filter.

5. The audio conditioning apparatus as claimed in claim 1, wherein said audio conditioning apparatus is connectable to a headphone loudspeaker usable for reproduction of the audio signal, and wherein said audio conditioning apparatus further comprises an active noise canceling unit for substantially cancelling environmental noise in a cancellation band of frequencies, the environmental noise being measurable by a microphone.

6. The audio conditioning apparatus as claimed in claim 5, wherein said audio conditioning apparatus further comprises a distance measuring device for measuring a distance between the microphone and the headphone loudspeaker.

7. An audio reproduction apparatus, comprising:
   a loudspeaker for reproduction of an audio signal;
   an access to an input audio signal on which the audio signal is based; and
   the audio conditioning apparatus as claimed in claim 1.

8. A method of conditioning an audio signal comprising the steps of:
   determining a noise level of environmental noise in a mid-range frequency noise band;
   amplifying a volume of the audio signal for all frequencies of the audio signal by a volume gain in dependence on solely the noise level in the mid-range frequency noise band;
   determining a further noise level of the environmental noise in either a bass frequency noise band or a treble frequency noise band; and
   amplifying frequency components in a bass frequency audio band or a treble frequency audio band of the audio signal by a further gain, a value of said further gain being dependent solely on the further noise level of the environmental noise in the bass frequency noise band or the treble frequency noise band, respectively, to perceptually mask the environmental noise in the base frequency noise band or the treble frequency noise band from a respective base frequency or treble frequency audio band of the volume amplified audio signal,
   wherein said step of determining a noise level of environmental noise is based on a mid frequency noise band of the environmental noise, said mid-range frequency noise band being complementary to said bass frequency noise band and said treble frequency noise band, covering frequencies not in said base frequency noise band and said treble frequency noise band,
   and wherein said method further comprises the step of:
   allocating a maximum allowable gain of said amplifying steps on the basis of available headroom for amplification.

9. A computer readable medium containing a computer program product enabling a processor to execute the method as claimed in claim 8.

* * * * *